United States Patent
Obata (10) Patent No.: US 6,601,216 B1
(45) Date of Patent: Jul. 29, 2003

(54) DIFFERENTIAL CYCLIC REDUNDANCY CHECK

(75) Inventor: Kenji C. Obata, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/539,372

(22) Filed: Mar. 31, 2000

(51) Int. Cl.⁷ .............................................. H03M 13/09
(52) U.S. Cl. ...................................................... 714/807
(58) Field of Search ......................................... 714/807

(56) References Cited

U.S. PATENT DOCUMENTS

| | | | | |
|---|---|---|---|---|
| 5,479,654 A | * | 12/1995 | Squibb | 707/201 |
| 5,765,173 A | * | 6/1998 | Cane et al. | 707/101 |
| 5,850,565 A | * | 12/1998 | Wightman | 710/1 |
| 5,978,805 A | * | 11/1999 | Carson | 707/10 |
| 6,101,507 A | * | 8/2000 | Cane et al. | 707/201 |
| 6,269,374 B1 | * | 7/2001 | Chen et al. | 705/51 |
| 6,357,030 B1 | * | 3/2002 | Demura et al. | 714/755 |
| 6,374,264 B1 | * | 4/2002 | Bohannon et al. | 707/2 |
| 6,449,688 B1 | * | 9/2002 | Peters et al. | 707/205 |

OTHER PUBLICATIONS

*American National Standard Institute, Inc.*, "American National Standard for advanced data communication control procedures (ADCCP)," 1979, ANSI X3.66–1979, 1–109.

* cited by examiner

*Primary Examiner*—Stephen M. Baker
(74) *Attorney, Agent, or Firm*—Woodcock Washburn LLP

(57) ABSTRACT

A method for generating error check bits in a digital system is suited for use in a system in which a previously stored data page is modified. The method comprises retrieving a previously computed set of error check bits, which we denote CRC(old page), for a previously stored page of data; and then, upon receiving an indication that the "old page" has been modified, updating the error check bits by incrementally updating CRC(old page) in accordance with the equation,

*CRC*(new page)=*CRC*(old page) *XOR CRC*(Δ page), where CRC(Δ page) is computed by taking advantage of the fact that Δ page (i.e., a page where all bits are 0 except for those bit positions where the data has been modified) is sparse.

18 Claims, 2 Drawing Sheets

DIFFERENTIAL CYCLIC REDUNDANCY CHECK

FIELD OF THE INVENTION

The present invention relates generally to the field of error detection in digital systems. More particularly, the invention relates to an improved error detection algorithm that is particularly useful in, although not limited to, applications involving the detection of errors in database systems and file systems, which are characterized by relatively small modifications made to previously stored pages of data.

BACKGROUND OF THE INVENTION

Digital devices are often required to transmit or store data on unreliable media. For example, bits transmitted on a phone line via modem or written to a disk may not necessarily be identical to those received on the other end of the line or read from the disk at a later time due to electronic interference, physical damage, etc. Since many such devices, computers in particular, are highly sensitive to the accuracy of the data they process, it is desirable to have a mechanism for detecting errors in data storage and transmission. This gives the device an opportunity to deal with the erroneous data gracefully. For example, a program may ignore or attempt recovery of a corrupt page on a disk, or a modem may request a retransmission of a damaged chunk of a transmission.

Error detection is often accomplished by including some number of error check bits along with the content bits. The error check bits are some function of the content bits. The check bits are recomputed on the receiving end, and compared with the transmitted check bits. The relationship between the content and check bits is such that, if an error occurred during transmission, with high probability the computed check bits will be inconsistent with the transmitted check bits and the error will be detected.

One of these techniques, the cyclic redundancy check (CRC), is probably the most widely used error detection method in the world. For instance, a version is used in the U.S. communication standard ANSI X3.66 and the European CCITT X.25, as well as in countless software products. The X3.66 standard refers to the CRC algorithm as the Frame Check Sequence, or FCS, which is described in Appendix D of ANSI 3.66-1979.

Current methods for computing the CRC accept a sequential stream of input data, compute the CRC, and emit the CRC check bits. This arrangement is convenient for many applications. However, suppose that one wishes to maintain a CRC for each page of a database file (a page is some convenient chunk of storage; for example, a typical page size is 4192 bytes). Each time data on the page is modified, the CRC must be recomputed in order to be made consistent with the new data. Current methods for doing this require starting from scratch, i.e., doing a sequential rescan of the entire page.

What is needed is a more efficient method for computing the error check bits, so that the complete CRC process does not have to be performed when only a small portion of the original data is modified, as in a database or file system.

SUMMARY OF THE INVENTION

The present invention provides a method for generating error check bits in a digital system. The invention is especially suited for use in a system in which a previously stored data page is modified. The inventive method comprises retrieving a previously computed set of error check bits, which we denote CRC(old page), for a previously stored page of data; and then, upon receiving an indication that the "old page" has been modified, updating the error check bits by incrementally updating CRC(old page) in accordance with the equation, $$CRC(\text{new page}) = CRC(\text{old page}) \; XOR \; CRC(\Delta \text{ page}),$$

where CRC($\Delta$ page) is computed by taking advantage of the fact that $\Delta$ page (i.e., a page where all bits are 0 except for those bit positions where the data has been modified) is sparse.

Other aspects of the present invention are described below.

BRIEF DESCRIPTION OF THE DRAWINGS

The foregoing summary and the following detailed description of presently preferred embodiments are better understood when read in conjunction with the appended drawings, in which.

DETAILED DESCRIPTION OF PREFERRED EMBODIMENTS

The present invention provides a mechanism for performing a differential update of the CRC. While the following discussion describes an embodiment of the invention in which a desktop computer computes CRC check bits for disk files, the present invention is not limited to that use. The invention may also be employed on any type of computer network or individual computer having data stores for files, e-mail messages, databases and the like. The information from all such stores can be processed together or separately in accordance with the invention.

The present invention will now be explained with reference to a presently preferred embodiment thereof. An overview of the invention is provided first. After this overview, a description of an exemplary computer environment is provided. Finally, a detailed description of the inventive differential CRC method is provided.

Overview

The present invention provides a method for performing a differential update of the CRC. That is, given the set of changes to the page (the set of bytes to be written and the positions on the page) and the old CRC, it computes the resulting changes to the CRC check bits without having to look at any of the unchanged regions of the page. In a typical scenario in which only a relatively small fraction of a page is updated at a time, the differential update may be many multiples faster than re-computing the CRC from scratch.

The inventive algorithm recognizes and takes advantage of the identity:

$$CRC(\text{new page}) = CRC(\text{old page}) \; XOR \; CRC(\Delta \text{ page}),$$

where "$\Delta$ page" is a page of "0"s representing unchanged bits and "1"s representing changed (flipped) bits. Thus, CRC(new page) can be derived quickly by simply adding (XOR-ing) CRC(Δ page) to the already known CRC for the old page (i.e., the page before modifications have been made).

The invention further involves an algorithm for efficiently computing CRC(Δ page), by taking advantage of the fact that Δ page will be sparse (mostly 0's). This algorithm for computing CRC(Δ page) involves pre-computing and memorizing (in a lookup table) CRC check bits for certain predefined error patterns. The value of CRC(Δ page) is determined from the following equation:

$$CRC(\Delta\ page)=CRC(f(x)*\Delta(x)),$$

where $f(x)$ and $\Delta(x)$ are polynomials, $f(x)$ being the polynomial form of the look-up table entry corresponding to the region in which the page was modified and $\Delta(x)$ being the polynomial form of the modified data region.

Figure 2:
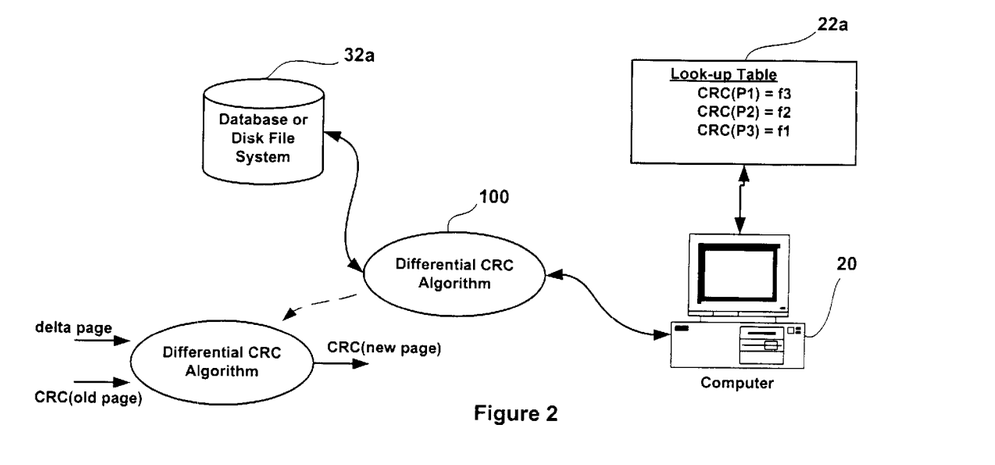
FIG. 2 schematically depicts a digital system employing the present invention.

One embodiment of a system employing the present invention is schematically depicted in FIG. 2, discussed below, which illustrates how the inventive Differential CRC algorithm generates new CRC bits (denoted CRC(new page)) based on the old CRC (denoted CRC(old page)) and the sparse Δ page.

Computer Environment

Figure 1:
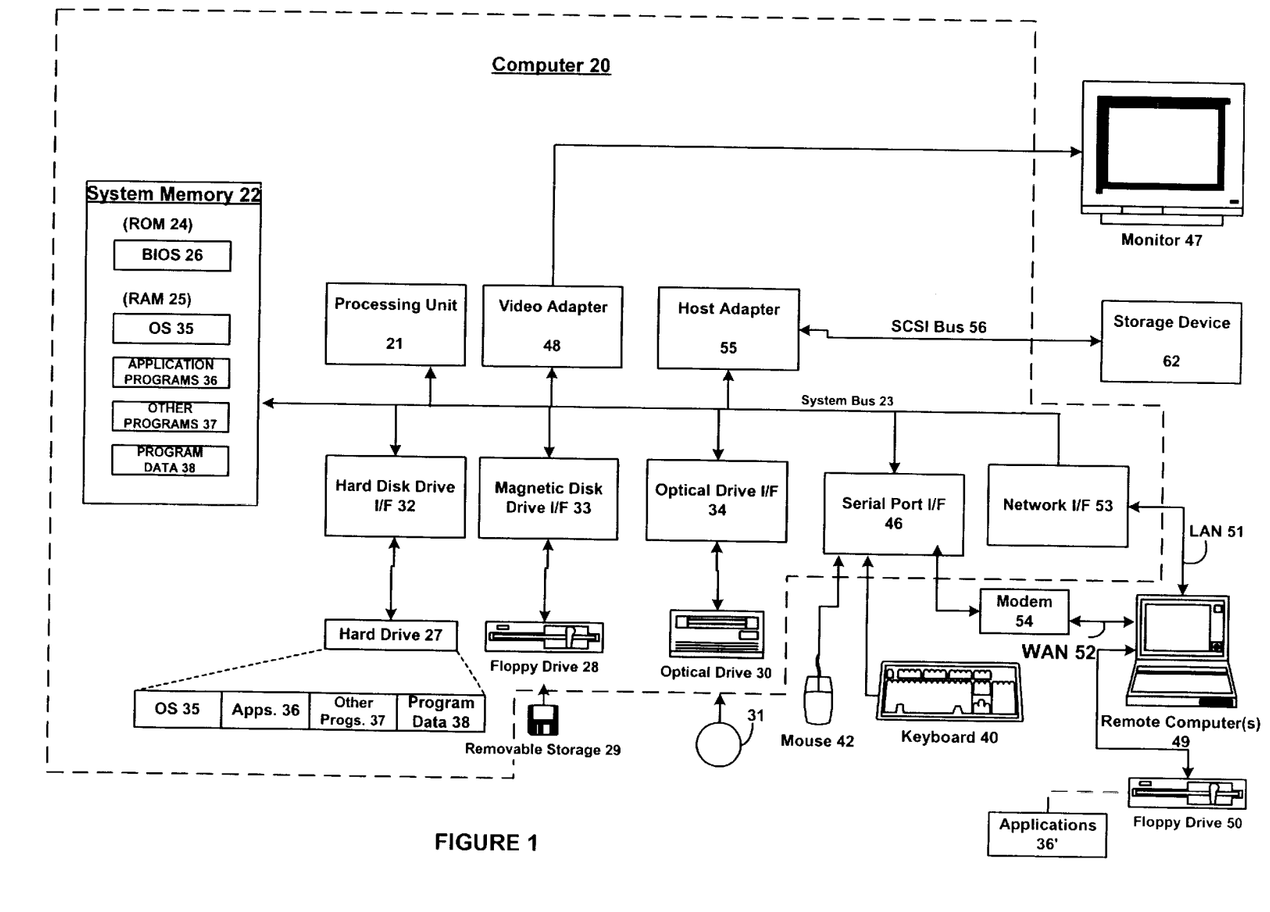
FIG. 1 is a block diagram representing a general purpose computer system in which aspects of the present invention may be incorporated.

The present invention may be implemented in a computer program executed on a computer. FIG. 1 and the following discussion are intended to provide a brief general description of a suitable computing environment in which the invention may be implemented. Although not required, the invention will be described in the general context of computer-executable instructions, such as program modules, being executed by a computer, such as a client workstation or a server. Generally, program modules include routines, programs, objects, components, data structures and the like that perform particular tasks or implement particular abstract data types. Moreover, those skilled in the art will appreciate that the invention may be practiced with other computer system configurations, including hand-held devices, multi-processor systems, microprocessor-based or programmable consumer electronics, network PCs, minicomputers, mainframe computers and the like. The invention may also be practiced in distributed computing environments where tasks are performed by remote processing devices that are linked through a communications network. In a distributed computing environment, program modules may be located in both local and remote memory storage devices.

As shown in FIG. 1, an exemplary general purpose computing system includes a conventional personal computer 20 or the like, including a processing unit 21, a system memory 22, and a system bus 23 that couples various system components including the system memory to the processing unit 21. The system bus 23 may be any of several types of bus structures including a memory bus or memory controller, a peripheral bus, and a local bus using any of a variety of bus architectures. The system memory includes read-only memory (ROM) 24 and random access memory (RAM) 25. A basic input/output system 26 (BIOS), containing the basic routines that help to transfer information between elements within the personal computer 20, such as during start-up, is stored in ROM 24. The personal computer 20 may further include a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD-ROM or other optical media. The hard disk drive 27, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide non-volatile storage of computer readable instructions, data structures, program modules and other data for the personal computer 20. Although the exemplary environment described herein employs a hard disk, a removable magnetic disk 29 and a removable optical disk 31, it should be appreciated by those skilled in the art that other types of computer readable media which can store data that is accessible by a computer, such as magnetic cassettes, flash memory cards, digital video disks, Bernoulli cartridges, random access memories (RAMs), read-only memories (ROMs) and the like may also be used in the exemplary operating environment.

A number of program modules may be stored on the hard disk, magnetic disk 29, optical disk 31, ROM 24 or RAM 25, including an operating system 35, one or more application programs 36, other program modules 37 and program data 38. A user may enter commands and information into the personal computer 20 through input devices such as a keyboard 40 and pointing device 42. Other input devices (not shown) may include a microphone, joystick, game pad, satellite disk, scanner or the like. These and other input devices are often connected to the processing unit 21 through a serial port interface 46 that is coupled to the system bus, but may be connected by other interfaces, such as a parallel port, game port or universal serial bus (USB). A monitor 47 or other type of display device is also connected to the system bus 23 via an interface, such as a video adapter 48. In addition to the monitor 47, personal computers typically include other peripheral output devices (not shown), such as speakers and printers. The exemplary system of FIG. 1 also includes a host adapter 55, Small Computer System Interface (SCSI) bus 56, and an external storage device 62 connected to the SCSI bus 56.

The personal computer 20 may operate in a networked environment using logical connections to one or more remote computers, such as a remote computer 49. The remote computer 49 may be another personal computer, a server, a router, a network PC, a peer device or other common network node, and typically includes many or all of the elements described above relative to the personal computer 20, although only a memory storage device 50 has been illustrated in FIG. 1. The logical connections depicted in FIG. I include a local area network (LAN) 51 and a wide area network (WAN) 52. Such networking environments are commonplace in offices, enterprise-wide computer networks, intranets and the Internet.

When used in a LAN networking environment, the personal computer 20 is connected to the LAN 51 through a network interface or adapter 53. When used in a WAN networking environment, the personal computer 20 typically includes a modem 54 or other means for establishing communications over the wide area network 52, such as the Internet. The modem 54, which may be internal or external, is connected to the system bus 23 via the serial port interface 46. In a networked environment, program modules depicted relative to the personal computer 20, or portions thereof, may be stored in the remote memory storage device. It will be appreciated that the network connections shown are exemplary and other means of establishing a communications link between the computers may be used.

Basic CRC

The cyclic redundancy check interprets data as coefficients of a large polynomial. The coefficients are drawn from a finite field of the same size as the number of characters in the data alphabet. For instance, when working with binary data, which expresses data using two symbols, 0 and 1, the coefficients are treated as integers modulo 2. The bit at position k is identified with the coefficient of the term $x^k$. So, the binary data 10110001 might be represented by the polynomial $x^7+x^5+x^4+1$. The CRC computation depends on this and another polynomial, the check polynomial, which we will write as p(x). The particular choice of p(x) is agreed upon in advance (for instance, the standards referenced above define particular choices of the check polynomial). The degree of p(x) is equal to the number of check characters (bits for binary data), and determines the particular error patterns which will be detected by the CRC.

The computation of the CRC itself is simple: Let k be the degree of the check polynomial p(x) and let f(x) be the polynomial corresponding to the data to be transmitted. Compute the polynomial r(x) by taking $x^k f(x)$ modulo p(x) (r(x) is the remainder when $x^k f(x)$ is divided by p(x)). The error check characters are the coefficients of −r(x). In other words, the transmitted data would be the coefficients of the polynomial $x^k f(x)−r(x)$ (multiplication by $x^k$ simply shifts the data over k characters to make room for the check characters). Note that for the most typical case, binary data, addition and subtraction are equivalent, so the negation may be omitted. The check is verified by computing the transmitted polynomial again modulo r(x). If the data has been transmitted without error, the result will be zero. A nonzero result indicates that a transmission error has occurred.

Differential CRC

Referring to FIG. 2, the Differential CRC algorithm 100 of the present invention may be associated with a computer 20 that reads and writes files to a disk storage medium 32a. As shown, the invention is preferably carried out with the use of a memory-resident lookup table 22a. The Differential CRC algorithm 100 receives as inputs an old CRC, CRC(old page), and the sparse Δ page, and outputs CRC bits CRC (new page). A presently preferred implementation of the algorithm will now be described in detail.

For convenience, we will use underlined type to indicate reduction modulo the check polynomial p(x) i.e. f(x) mod p(x)=$\underline{f(x)}$. So, the CRC check characters are just the coefficients of the polynomial $−\underline{x^k f(x)}$. The differential update algorithm depends on the "homomorphism" properties of modular reductions which, roughly, state that all arithmetic operations performed on polynomials are preserved under reduction modulo a fixed polynomial.

Suppose that f(x) is the polynomial corresponding to a data page, and $\underline{g(x)}=−\underline{x^k f(x)}$ is the corresponding CRC polynomial. We want to modify some entries on the page to obtain a new page with corresponding polynomial f'(x) and efficiently compute the new corresponding CRC polynomial $\underline{g'(x)}=−\underline{x^k f'(x)}$.

Let Δ(x) denote the polynomial corresponding to the differences between the two pages, Δ(x)=f'(x)−f(x).

Then, $$\underline{g'(x)} = −\underline{x^k f'(x)}$$
$$= −\underline{x^k(f(x) + \Delta(x))}$$
$$= −\underline{x^k f(x)} + \underline{x^k \Delta(x)}$$
$$= −\underline{x^k f(x)} − \underline{x^k \Delta(x)}$$
$$= \underline{g(x)} + \underline{h(x)}$$

where h(x) is the polynomial corresponding to the CRC check bits of the page formed by taking the difference between the old and new pages. In other words, to update the CRC, it is enough to compute the check bits of the difference page and add it to the old check bits. This is useful because the difference page is often sparse (has very few nonzero entries), so its check bits can be computed quickly.

Suppose updates are done in consecutive t-bit chunks. Then the difference of a binary page might look like:

(modified chunk)
...0000000000000000000000100100010001100 00000000000000000000000000...
11 which corresponds to a Δ(x) of the form $$c_{mt}x^{mt}+c_{mt+1}x^{mt+1}+\cdots+c_{(m+1)t−1}x^{(m+1)t−1}$$

where the c's may be zero or one, and are the only nonzero terms of the polynomial.

To allow rapid computation of $−\underline{x^k \Delta(x)}$, we will maintain a lookup table T of powers of x modulo the check polynomial at each of the chunk boundaries:

$$T[i]=−\underline{x^k x^{it}}$$

Then the check bits of Δ(x) are $$−\underline{x^k(c_{mt}x^{mt}c_{mt+1}x^{mt+1}+\cdots+c_{(m+1)t−1}x^{(m+1)t−1})} =$$
$$−\underline{x^k x^{mt}(c_{mt}+C_{mt+1}x+\cdots+c_{(m+1)t−1}x^{t−1})} =$$
$$T[m](c_{mt}+C_{mt+1}x+\cdots+c_{(m+1)t−1}x^{t−1})$$

which can be rapidly computed: we need only do a table lookup, multiply two polynomials (of degrees at most k−1 and t−1), and reduce the resulting polynomial (of degree at most k+t−2) modulo the check polynomial. This last reduction is accelerated using another group of lookup tables. We choose a set of partition points $a_z$ with $$a_0=k<a_1<a_2<\ldots<a_w=k+t−1$$

and let $$Q_z[p(x)]=\underline{p(x)}$$

where z runs from 1 to w and, for each table $Q_z$, p(x) runs through all polynomials with zero coefficients for all terms other than $x^a_{z−1},\ldots,x^{(a−1)}_z$. The polynomial p(x) to be reduced is decomposed into the sum of w polynomials of this form, plus the polynomial $p_0(x)$ consisting of the first k terms of p(x):

$$p(x)=p_0(x)+p_1(x)+p_2(x)+\ldots+p_w(x)$$

The reduction of $p_0(x)$ modulo a degree k polynomial is exactly $p_0(x)$, and the reductions of the other polynomials are available in our lookup tables, so $$p(x)=p_0(x)+Q_1[p_1(x)]+Q_2[p_2(x)]+ \ldots +Q_w[p_w(x)]$$

requiring just w table lookups and adds.

In the binary case, the polynomial multiplication step is very easy. We store each polynomial in a register, with the degree d term corresponding to bit d, say registers p1 and p2. Then the product is computed as follows:

Res=0
While p1≠0
   If low bit of p1 is set
      Res=Res XOR p2
   Shift the bits of p1 to the right
   Shift the bits of p2 to the left Finally, in case the changes do not fall within a single chunk, we simply perform the updates a single chunk at a time, as above.

Our exemplary implementation of the algorithm uses the degree 32 ANSI X3.66 check polynomial, 32-bit chunks, and four reduction tables corresponding to partition points 32, 40, 48, 56, and 64. An illustrative set of program modules for carrying out the present invention is set forth below in the Appendix preceding the claims.

Figure 3:
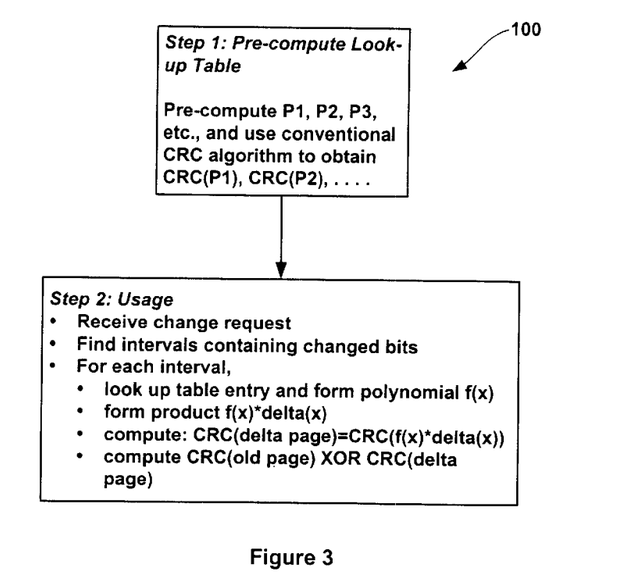
FIG. 3 is a flowchart of a presently preferred implementation of the present invention.

The algorithm will now be summarized with reference to the flowchart of FIG. 3.

As shown, the first step involves pre-computing the lookup table entries, i.e., pre-computing pages P1, P2, P3, etc., and then computing and storing the CRC bits for these pages. The next step is performed when a change request is made. In this step, the algorithm finds intervals containing changed bits; and then for each such interval it looks up a table entry and forms the polynomial f(x); then forms the product f(x)*Δ(x); then computes $$CRC(\Delta\ page)=CRC(f(x)*\Delta(x));$$

and finally computes, $$CRC(\text{new page})\ CRC(\text{old page})\ XOR\ CRC(\Delta\ \text{page}).$$

Conclusion

In sum, the present invention provides an error detection algorithm that is particularly useful in applications involving the detection of errors in database systems and file systems that are characterized by relatively small modifications made to previously stored pages of data. It is understood, however, that the invention is susceptible to various modifications and alternative constructions. It should be understood that there is no intention to limit the invention to the specific constructions described herein. On the contrary, the invention is intended to cover all modifications, alternative constructions, and equivalents falling within the scope and spirit of the invention.

It should also be noted that the present invention may be implemented in a variety of database and database management applications, as well as file systems. The various techniques described herein may be implemented in hardware or software, or a combination of both. Preferably, the techniques are implemented in computer programs executing on programmable computers that each include a processor, a storage medium readable by the processor (including volatile and non-volatile memory and/or storage elements), at least one input device, and at least one output device. Program code is applied to data entered using the input device to perform the finctions described above and to generate output information. The output information is applied to one or more output devices. Each program is preferably implemented in a high level procedural or object oriented programming language to communicate with a computer system. However, the programs can be implemented in assembly or machine language, if desired. In any case, the language may be a compiled or interpreted language. Each such computer program is preferably stored on a storage medium or device (e.g., ROM or magnetic diskette) that is readable by a general or special purpose programmable computer for configuring and operating the computer when the storage medium or device is read by the computer to perform the procedures described above. The system may also be considered to be implemented as a computer-readable storage medium, configured with a computer program, where the storage medium so configured causes a computer to operate in a specific and predefined manner.

APPENDIX

EXEMPLARY CODE

```
//    ----------------------------------------------------------------
//
//    File:           crchash.hxx
//
//    Synopsis:       Defines classes which implement static and differential
//                    cyclic redundancy checks
//
//
//
//    ----------------------------------------------------------------
#ifndef __DIFFCRC_HXX
#define __DIFFCRC_HXX
extern DWORD g_rgdwPower[];
extern DWORD g_rgdwRes32[];
extern DWORD g_rgdwRes40[];
extern DWORD g_rgdwRes48[];
extern DWORD g_rgdwRes56[];
//    +---------------------------------------------------------------
//
//    Class:          CDiffCrcInitializer
//
//    Synopsis:       Initializes lookup tables used for CRC computations
//
//
```

APPENDIX-continued

EXEMPLARY CODE

```
//
// ---------------------------------------------------------------------------
class CDiffCrcInitializer
{
public:
        CDiffCrcInitializer ();
private:
        // initializes the g_pdwResXX tables
        void InitResTable (DWORD *pdwTable, DWORD dwDeg);
};
//   +-------------------------------------------------------------------------
//
//       Class:          CDiffCrc
//
//       Synopsis:       Defines a class for performing differential updates of a
//                       page CRC. Also provides static functions for computing
//                       static CRCs. The page may be no larger than 4K (1024
dwords)
//                       and the first dword is reserved for the check bits. Every
//                       update to the page must be made through UpdateCrc. Page
//                       integrity is checked by calling ValidateCrc.
//
// ---------------------------------------------------------------------------
class CDiffCrc
{
protected:
        // pointer to the page
        DWORD *m_pdwPage;
        // page signature
        DWORD m_dwSig;
public:
        CDiffCrc (DWORD *pdwPage, DWORD dwSig) :
          m_pdwPage (pdwPage), m_dwSig (dwSig)
        {}
        // initializes the error check bits for a new page
        void InitializeCrc (DWORD dwLen);
        // updates content and error check bits on the page
        void UpdateCrc (DWORD dwPos, DWORD *pdwNewData, DWORD dwLen);
        // validates the error check information on the page
        BOOL ValidateCrc (DWORD dwLen);
        // compute static crc32
        static DWORD Crc32 (DWORD *pdwPage, DWORD dwLen);
private:
        inline DWORD UpdateCrcInternal (DWORD dwPos, DWORD dwNewData);
};
//   +-------------------------------------------------------------------------
//
//       Method:         CDiffCrc::UpdateCrcInternal
//
//       Synopsis:       Computes the CRC diff which will result from overwriting the
//                       dword at dwPos with dwNewData
//
//
//
// ---------------------------------------------------------------------------
inline DWORD
CDiffCrc::UpdateCrcInternal (DWORD dwPos, DWORD dwNewData)
{
        DWORD dwDelta = dwNewData ^ m_pdwPage[dwPos];
        // we provide an optimized assembly language version for Intel chips,
        // from Pentium Pro down, since the 64-bit arithmetic provided by VC
        // cannot be inlined; otherwise (Alpha and Merced), native DWORDLONG
        // operations should be fine
#ifdef _M_IX86
        DWORD dwHigh = 0;
        DWORD dwLow = 0;
        _asm push esi
        _asm push edi
        _asm xor esi, esi
        _asm xor edi, edi
        _asm xor edx, edx
        _asm mov ebx, dwPos
        _asm mov eax, dword ptr [g_rgdwPower+4*ebx]
        _asm mov ecx, dwDelta
#define DCRC_UPDATEROUND(k)     _asm mov ebx, ecx \
                                _asm and ebx, 1 \
                                _asm jz DCRC_UPDATEROUND##k \
```

APPENDIX-continued

EXEMPLARY CODE

```
                                          __asm xor esi, edx \
                                          __asm xor edi, eax
#define DCRC__UPDATEROUND2(k)    DCRC__UPDATEROUND##k: \
                                          __asm shld edx, eax, 1 \
                                          __asm shl eax, 1 \
                                          __asm shr ecx, 1
    DCRC__UPDATEROUND (0)
    DCRC__UPDATEROUND2 (0)
    DCRC__UPDATEROUND (1)
    DCRC__UPDATEROUND2 (1)
    DCRC__UPDATEROUND (2)
    DCRC__UPDATEROUND2 (2)
    DCRC__UPDATEROUND (3)
    DCRC__UPDATEROUND2 (3)
    DCRC__UPDATEROUND (4)
    DCRC__UPDATEROUND2 (4)
    DCRC__UPDATEROUND (5)
    DCRC__UPDATEROUND2 (5)
    DCRC__UPDATEROUND (6)
    DCRC__UPDATEROUND2 (6)
    DCRC__UPDATEROUND (7)
    DCRC__UPDATEROUND2 (7)
    DCRC__UPDATEROUND (8)
    DCRC__UPDATEROUND2 (8)
    DCRC__UPDATEROUND (9)
    DCRC__UPDATEROUND2 (9)
    DCRC__UPDATEROUND (10)
    DCRC__UPDATEROUND2 (10)
    DCRC__UPDATEROUND (11)
    DCRC__UPDATEROUND2 (11)
    DCRC__UPDATEROUND (12)
    DCRC__UPDATEROUND2 (12)
    DCRC__UPDATEROUND (13)
    DCRC__UPDATEROUND2 (13)
    DCRC__UPDATEROUND (14)
    DCRC__UPDATEROUND2 (14)
    DCRC__UPDATEROUND (15)
    DCRC__UPDATEROUND2 (15)
    DCRC__UPDATEROUND (16)
    DCRC__UPDATEROUND2 (16)
    DCRC__UPDATEROUND (17)
    DCRC__UPDATEROUND2 (17)
    DCRC__UPDATEROUND (18)
    DCRC__UPDATEROUND2 (18)
    DCRC__UPDATEROUND (19)
    DCRC__UPDATEROUND2 (19)
    DCRC__UPDATEROUND (20)
    DCRC__UPDATEROUND2 (20)
    DCRC__UPDATEROUND (21)
    DCRC__UPDATEROUND2 (21)
    DCRC__UPDATEROUND (22)
    DCRC__UPDATEROUND2 (22)
    DCRC__UPDATEROUND (23)
    DCRC__UPDATEROUND2 (23)
    DCRC__UPDATEROUND (24)
    DCRC__UPDATEROUND2 (24)
    DCRC__UPDATEROUND (25)
    DCRC__UPDATEROUND2 (25)
    DCRC__UPDATEROUND (26)
    DCRC__UPDATEROUND2 (26)
    DCRC__UPDATEROUND (27)
    DCRC__UPDATEROUND2 (27)
    DCRC__UPDATEROUND (28)
    DCRC__UPDATEROUND2 (28)
    DCRC__UPDATEROUND (29)
    DCRC__UPDATEROUND2 (29)
    DCRC__UPDATEROUND (30)
    DCRC__UPDATEROUND2 (30)
    DCRC__UPDATEROUND (31)
    DCRC__UPDATEROUND2 (31)
    __asm
    {
      mov edx, esi
      mov eax, edi
      mov ebx, edx
      and ebx, 0ffh
      xor eax, dword ptr [g__rgdwRes32+4*ebx]
```

APPENDIX-continued

EXEMPLARY CODE

```
            shr edx, 8
            mov ebx, edx
            and ebx, 0ffh
            xor eax, dword ptr [g__rgdwRes40+4*ebx]
            shr edx, 8
            mov ebx, edx
            and ebx, 0ffh
            xor eax, dword ptr [g__rgdwRes48+4*ebx]
            shr edx, 8
            mov ebx, edx
            and ebx, 0ffh
            xor eax, dword ptr [g__rgdwRes56+4*ebx]
            mov dwLow, eax
            pop edi
            pop esi
        }
        return dwLow;
#else // _M_IX86
        DWORDLONG qwPower = g__rgdwPower[dwPos];
        DWORDLONG qwProd = 0;
#define DCRC_UPDATEROUND     if (dwDelta & 1) { qwProd ^= qwPower; } qwPower <<=
1; dwDelta >>= 1
        DCRC_UPDATEROUND; DCRC_UPDATEROUND; DCRC_UPDATEROUND; DCRC_UPDATEROUND;
        DCRC_UPDATEROUND; DCRC_UPDATEROUND; DCRC_UPDATEROUND; DCRC_UPDATEROUND;
        DCRC_UPDATEROUND; DCRC_UPDATEROUND; DCRC_UPDATEROUND; DCRC_UPDATEROUND;
        DCRC_UPDATEROUND; DCRC_UPDATEROUND; DCRC_UPDATEROUND; DCRC_UPDATEROUND;
        DCRC_UPDATEROUND; DCRC_UPDATEROUND; DCRC_UPDATEROUND; DCRC_UPDATEROUND;
        DCRC_UPDATEROUND; DCRC_UPDATEROUND; DCRC_UPDATEROUND; DCRC_UPDATEROUND;
        DCRC_UPDATEROUND; DCRC_UPDATEROUND; DCRC_UPDATEROUND; DCRC_UPDATEROUND;
        DCRC_UPDATEROUND; DCRC_UPDATEROUND; DCRC_UPDATEROUND; DCRC_UPDATEROUND;
        dwDelta = (DWORD) qwProd & 0xffffffff;
        qwProd >>= 32;
        dwDelta ^= g__rgdwRes32[qwProd & 0xff];
        qwProd >>= 8;
        dwDelta ^= g__rgdwRes40 [qwProd & 0xff];
        qwProd >>= 8;
        dwDelta ^= g__rgdwRes48[qwProd & 0xff];
        qwProd >>= 8;
        dwDelta ^= g__rgdwRes56[qwProd & 0xff];
        return dwDelta;
#endif // _M_IX86
{
#endif
//    +------------------------------------------------------------------------
//
//        File:          crchash.cxx
//
//        Synopsis:      Implements static and differential cyclic redundancy checks
//
//
//
//    ------------------------------------------------------------------------
#include "pch.cxx"
#include "crchash.hxx"
// internal lookup tables
DWORD g__rgdwPower[1024];
DWORD g__rgdwRes32[256];
DWORD g__rgdwRes40[256];
DWORD g__rgdwRes48[256];
DWORD g__rgdwRes56[256];
// initializer
static CDiffCrcInitializer g__diffcrcinitializer;
//
// The ANSI X3.66 check polynomial is
//
// x^32 + x^26 + x^23 + x^22 + x^16 + x^12 + x^11 + x^10 + x^8 + x^7 + x^5 + x^4 +
x^2 + x^1 + 1
//
// so the bit representation is
//
// 32 31 30 29 28 27 26 25 24 23 22 21 20 19 18 17 16 15 14 13 12 11 10  9  8  7  6
5 4 3 2 1 0
//  1  0  0  0  0  0  1  0  0  1  1  0  0  0  0  0  1  0  0  0  1  1  1  0  1  1  0
1 1 0 1 1 1
//     ----------- ----------- ----------- ----------- ----------- ----------- -----
------ -----------
// hex:      0           4           c           1           1           d
```

APPENDIX-continued

EXEMPLARY CODE

```
b          7
//
// where the highest order term is implicit
//
static DWORD g_dwPoly = 0x04c11db7;
//  +---------------------------------------------------------------------
//
//      Method:            CDiffCrcInitializer::CDiffCrcInitializer
//
//      Synopsis:     Initializes lookup tables used for CRC computations
//
//
//
//  ---------------------------------------------------------------------
CDiffCrcInitializer::CDiffCrcInitializer ()
{
        // start at 32-bit offset
        DWORD dwRes = g_dwPoly;
        for (DWORD i = 1; i < 1024; i++)
        {
          g_rgdwPower[i] = dwRes;
          for (DWORD j = 0; j < 32; j++)
          {
            if (dwRes & 0x80000000)
            {
              dwRes <<= 1;
              dwRes ^= g_dwPoly;
            }
            else
            {
              dwRes <<= 1;
            }
          }
        }
        InitResTable (g_rgdwRes32, 32);
        InitResTable (g_rgdwRes40, 40);
        InitResTable (g_rgdwRes48, 48);
        InitResTable (g_rgdwRes56, 56);
}
//  +---------------------------------------------------------------------
//
//      Method:            CDiffCrcInitializer::InitResTable
//
//      Synopsis:     Initializes the residue table starting at degree dwDeg
//
//
//
//  ---------------------------------------------------------------------
void
CDiffCrcInitializer::InitResTable (DWORD *pdwTable, DWORD dwDeg)
{
        // residue table has size 2^8
        DWORD rgdwRes[8];
        // start at constant term
        DWORD dwRes = 1;
        for (DWORD i = 0; i < dwDeg; i++)
        {
          if (dwRes & 0x80000000)
          {
            dwRes <<= 1;
            dwRes ^= g_dwPoly;
          }
          else
          {
            dwRes <<= 1;
          }
        }
        for (i = 0; i < 8; i++)
        {
          rgdwRes[i] = dwRes;
          if (dwRes & 0x80000000)
          {
            dwRes <<= 1;
            dwRes ^= g_dwPoly;
          }
          else
          {
```

APPENDIX-continued

EXEMPLARY CODE

```
            dwRes <<= 1;
         }
      }
      for (i = 0; i < 256; i++)
      {
         DWORD dwThisRes = 0;
         for (DWORD j = 0; j < 8; j++)
         {
            if ((i >> j) & 0x01)
            {
               dwThisRes ^= rgdwRes[j];
            }
         }
         pdwTable[i]= dwThisRes;
      }
}
//   +-------------------------------------------------------------------
//
//
//   Method:          CDiffCrc::Crc32
//
//   Synopsis:        Computes a static crc32 of a dword array
//
//
//
//   -------------------------------------------------------------------
DWORD
CDiffCrc::Crc32 (DWORD *pdwPage, DWORD dwLen)
{
         DWORD dwCrc = 0;
         pdwPage += (dwLen-1);
         while (dwLen)
         {
            // push in the current dword
            DWORD dwCrcUpdate =
               g_rgdwRes32[dwCrc & 0xff]          ^
               g_rgdwRes40[(dwCrc >> 8) & 0xff]   ^
               g_rgdwRes48[(dwCrc >> 16) & 0xff]  ^
               g_rgdwRes56[dwCrc >> 24];
            dwCrc = *pdwPage ^ dwCrcUpdate;
            dwLen--;
            pdwPage--;
         }
         // push a zero dword
         dwCrc ^= g_rgdwRes32[dwCrc & 0xff]       ^
            g_rgdwRes40[(dwCrc >> 8) & 0xff]      ^
            g_rgdwRes48[(dwCrc >> 16) & 0xff]     ^
            g_rgdwRes56[dwCrc >> 24];
         return dwCrc;
}
//   +-------------------------------------------------------------------
//
//   Method:          CDiffCrc::InitializeCrc
//
//   Synopsis:        Initializes the CRC for a page; use this the first time a
//                    page is created for differential CRC update
//
//
//
//   -------------------------------------------------------------------
void
CDiffCrc::InitializeCrc (DWORD dwLen)
{
         DWORD dwDiff;
         // init crc with signature
         m_pdwPage[0]= m_dwSig;
         // start at beginning (crc is first dword)
         DWORD dwPos = 1;
         while (dwLen)
         {
            // compute crc for this dword
            dwDiff = UpdateCrcInternal (dwPos, 0);
            // update crc
            m_pdwPage[0] ^= dwDiff;
            // next dword
            dwPos++;
            dwLen--;
         }
```

APPENDIX-continued

EXEMPLARY CODE

```
}
//   +-------------------------------------------------------------------------
//
//
//        Method:         CDiffCrc::UpdateCrc
//
//        Synopsis:       Performs an update on the page. This writes the dwLen DWORDs
//                        at pdwNewData to position dwPos, and updates the CRC check
//
//
//
//   -------------------------------------------------------------------------
void
CDiffCrc::UpdateCrc (DWORD dwPos, DWORD *pdwNewData, DWORD dwLen)
{
        DWORD dwDiff;
        DWORD dwDiffAccum = 0;
        while (dwLen)
        {
          // compute crc diff
          dwDiff = UpdateCrcInternal (dwPos, *pdwNewData);
          // update data
          m_pdwPage[dwPos] = *pdwNewData;
          // and crc delta
          dwDiffAccum ^= dwDiff;
          // next dword
          dwPos++;
          pdwNewData++;
          dwLen--;
        }
        // update crc in page
        m_pdwPage[0] ^= dwDiffAccum;
}
//   +-------------------------------------------------------------------------
//
//        Method:         CDiffCrc::ValidateCrc
//
//        Synopsis:       Validates the CRC check on the page; returns TRUE if no
//                        errors are detected, false otherwise
//
//        Arguments:      DWORD dwLen   - length of the page (in dwords)
//
//
//
//   -------------------------------------------------------------------------
BOOL
CDiffCrc::ValidateCrc (DWORD dwLen)
{
        return m_dwSig ==
          ( Crc32(m_pdwPage+1, dwLen-1) ^ m_pdwPage[0] );
}
```

I claim:

1. A method for generating error check bits in a digital system, comprising:

storing a page of digital information (old page) and associated CRC check bits (CRC(old page));

receiving an indication that a new page has been created from the old page by modification of at least some of the bits making up the page of digital information;

forming a page of data (Δ page) indicative of the changed bits; and computing CRC check bits (CRC(new page)) for the new page based on CRC(old page) and CRC check bits for Δ page CRC(Δ page), wherein CRC(Δ page) is obtained from a pre-computed lookup table containing CRC check bits for predefined error patterns.

2. A method as recited in claim 1, wherein each page is made up of a prescribed number of bits.

3. A method as recited in claim 2, wherein Δ page is sparse.

4. A method as recited in claim 3, wherein the old page and new page are stored in a database system.

5. A method as recited in claim 3, wherein the old page and new page are stored in a file system.

6. A method as recited in claim 3, comprising the step of computing CRC(new page) in accordance with the equation, $$CRC(\text{new page}) = CRC(\text{old page}) \; XOR \; CRC(\Delta \text{ page}).$$

7. A method for generating error check bits in a digital system, comprising:

storing a page of digital information (old page) and associated CRC check bits (CRC(old page));

receiving an indication that a new page has been created from the old page by modification of at least some of the bits making up the page of digital information;

forming a page of data (Δ page) indicative of the changed bits, wherein Δ page is sparse; and computing CRC check bits (CRC(new page)) for the new page based on CRC(old page) and Δ page, wherein CRC(new page) is computed in accordance with the equation, $$CRC(\text{new page}) = CRC(\text{old page}) \; XOR \; CRC(\Delta \text{ page}); \text{ and}$$

further comprising a first step involving pre-computing a lookup table, wherein the lookup table is formed by pre-computing and storing in the lookup table CRC bits for prescribed pages (P1, P2, P3, etc.).

8. A method as recited in claim 7, further comprising, after receiving a change request:

finding intervals containing changed bits;

for each such interval, looking up a table entry and forming a CRC polynomial f(x) based on the table entry and a polynomial Δ(x) based on Δ page;

forming the product f(x)*Δ(x);

computing CRC(Δ page)=CRC(f(x)*Δ(x)); and computing CRC(new page)=CRC(old page) XOR CRC(Δ page).

9. A computer readable storage medium comprising code for instructing a computer in carrying out the steps recited in claim 1.

10. A computer readable storage medium comprising code for instructing a computer in carrying out the steps recited in claim 8.

11. A digital system, comprising:

a computer;

a computer readable storage medium operatively coupled to the computer; and computer code executable by the computer for carrying a differential algorithm for generating error check bits, wherein said algorithm comprises:

i. storing in the storage medium a page of digital information (old page) and associated CRC check bits (CRC(old page));

ii. receiving an indication that a new page has been created from the old page by modification of at least some of the bits making up the page of digital information;

iii. forming a page of data (Δ page) indicative of the changed bits; and iv. computing CRC check bits (CRC(new page)) for the new page based on CRC(old page) and CRC check bits for Δ page CRC(Δ page), wherein CRC(Δ page) is obtained from a pre-computed lookup table containing CRC check bits for predefined error patterns.

12. A system as recited in claim 11, wherein each page is made up of a prescribed number of bits.

13. A system as recited in claim 12, wherein Δ page is sparse.

14. A system as recited in claim 13, wherein the old page and new page are stored in a database system.

15. A system as recited in claim 13, wherein the old page and new page are stored in a file system.

16. A system as recited in claim 13, wherein the algorithm further comprises computing CRC(new page) in accordance with the equation, $$CRC(\text{new page}) = CRC(\text{old page}) \; XOR \; CRC(\Delta \text{ page}).$$

17. A digital system, comprising:

a computer;

a computer readable storage medium operatively coupled to the computer; and computer code executable by the computer for carrying a differential algorithm for generating error check bits, wherein said algorithm comprises:

storing in the storage medium a page of digital information (old page) and associated CRC check bits (CRC(old page));

receiving an indication that a new page has been created from the old page by modification of at least some of the bits making up the page of digital information;

forming a page of data (Δ page) indicative of the changed bits, wherein Δ page is sparse; and computing CRC check bits (CRC(new page)) for the new page based on CRC(old page) and Δ page, wherein CRC(new page) is computed in accordance with the equation $$CRC(\text{new page}) = CRC(\text{old page}) \; XOR \; CRC(\Delta \text{ page});$$

wherein the algorithm further comprises a first step involving pre-computing a lookup table, wherein the lookup table is formed by pre-computing and storing in the lookup table CRC bits for prescribed pages (P1, P2, P3, etc.).

18. A system as recited in claim 17, wherein the algorithm further comprises, after receiving a change request:

finding intervals containing changed bits;

for each such interval, looking up a table entry and forming a CRC polynomial f(x) based on the table entry and a polynomial Δ(x) based on Δ page;

forming the product f(x)*Δ(x);

computing CRC(Δ page)=CRC(f(x)*Δ(x)); and computing CRC(new page)=CRC(old page) XOR CRC(Δ page).

* * * * *